United States Patent
Choi et al.

(10) Patent No.: US 11,605,315 B2
(45) Date of Patent: Mar. 14, 2023

(54) DISPLAY DEVICE AND APPARATUS FOR, AND METHOD OF, MANUFACTURING THE DISPLAY DEVICE

(71) Applicant: Samsung Display Co., Ltd., Yongin-si (KR)

(72) Inventors: Myung Gil Choi, Yongin-si (KR); Jung Min Lee, Suwon-si (KR); Dong Woo Kim, Seoul (KR); Sang Moo Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 17/167,961

(22) Filed: Feb. 4, 2021

(65) Prior Publication Data

US 2021/0327312 A1  Oct. 21, 2021

(30) Foreign Application Priority Data

Apr. 16, 2020 (KR) .......................... 10-2020-0046013

(51) Int. Cl.
H05K 5/00 (2006.01)
G09F 9/30 (2006.01)
H05K 1/02 (2006.01)
H05K 1/18 (2006.01)

(52) U.S. Cl.
CPC .............. G09F 9/301 (2013.01); H05K 1/028 (2013.01); H05K 1/189 (2013.01); H05K 2201/10128 (2013.01)

(58) Field of Classification Search
CPC ........ G09F 9/301; H05K 1/028; H05K 1/189; H05K 2201/10128
USPC ........................................... 361/749
See application file for complete search history.

(56) References Cited

U.S. PATENT DOCUMENTS

| | | | |
|---|---|---|---|
| 8,074,351 B2 | 12/2011 | Hamada et al. | |
| 1,065,715 A1 | 12/2018 | Choi et al. | |
| 10,367,050 B2* | 7/2019 | Choi | H01L 51/0097 |
| 2016/0204183 A1* | 7/2016 | Tao | H01L 25/167 |
| | | | 438/34 |
| 2017/0062742 A1* | 3/2017 | Kim | H01L 51/5253 |
| 2018/0070455 A1 | 3/2018 | Lee et al. | |
| 2020/0004295 A1* | 1/2020 | Paek | G06F 1/1641 |

FOREIGN PATENT DOCUMENTS

| | | | | |
|---|---|---|---|---|
| CN | 109148380 B | * | 2/2021 | G09F 9/33 |
| KR | 10-2011-0036788 | | 4/2011 | |
| KR | 20-0461804 | | 8/2012 | |

(Continued)

*Primary Examiner* — Binh B Tran
(74) *Attorney, Agent, or Firm* — H.C. Park & Associates, PLC

(57) ABSTRACT

A display device, an apparatus for manufacturing a display device and a method of manufacturing a display device are provided. A display device includes a flexible substrate including a main region, a bending region, which extends from an end of the main region, and a sub-region, which extends from an end of the bending region, the sub-region being reversed from the bending region to be attached on a rear surface of the main region, and an active element layer disposed in the main region of the flexible substrate, wherein a thickness of the flexible substrate is greater in the bending region than in the main region and the sub-region.

12 Claims, 17 Drawing Sheets

(56) References Cited

FOREIGN PATENT DOCUMENTS

| KR | 10-1362295 | 2/2014 |
|---|---|---|
| KR | 10-2015-0061769 | 6/2015 |
| KR | 10-2015-0114407 | 10/2015 |
| KR | 10-1577278 | 12/2015 |
| KR | 10-1643821 | 7/2016 |
| KR | 10-2017-0104102 | 9/2017 |
| KR | 10-2017-0132382 | 12/2017 |
| KR | 10-2018-0011443 | 2/2018 |
| KR | 10-2018-0027665 | 3/2018 |
| KR | 10-2019-0014262 | 2/2019 |

* cited by examiner

FIG. 6
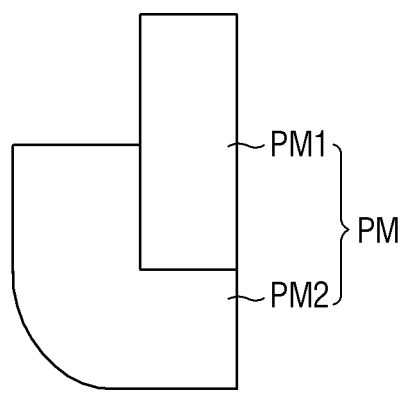
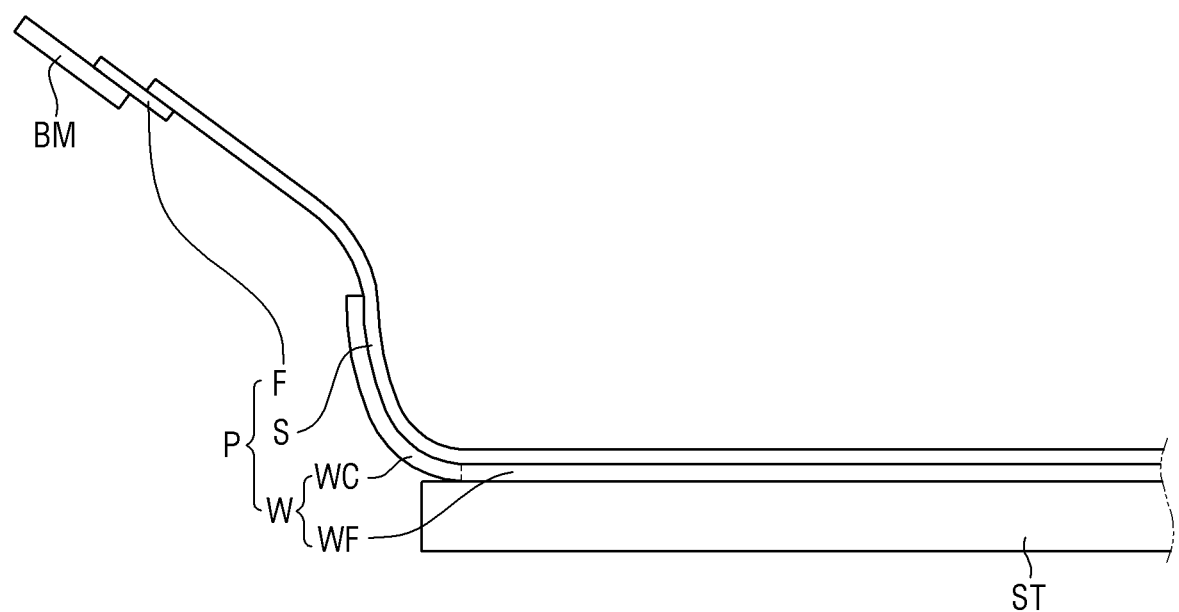
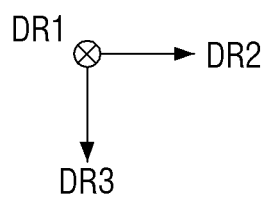

FIG. 8
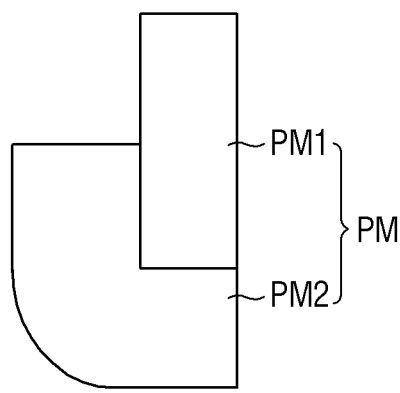
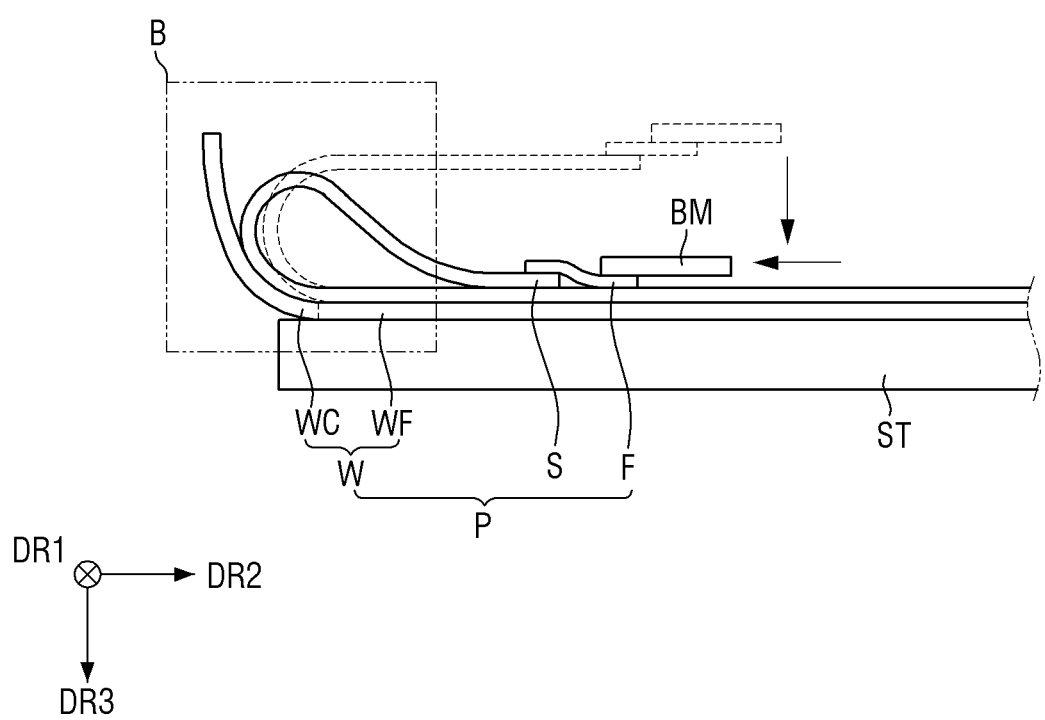

DISPLAY DEVICE AND APPARATUS FOR, AND METHOD OF, MANUFACTURING THE DISPLAY DEVICE

CROSS-REFERENCE TO RELATED APPLICATION

This application claims priority from and the benefit of Korean Patent Application No. 10-2020-0046013 filed on Apr. 16, 2020, which is hereby incorporated by reference for all purposes as if fully set forth herein.

BACKGROUND

Field

Exemplary embodiments of the invention relate generally to a display device and an apparatus for, and a method of, manufacturing the display device.

Discussion of Background

Electronic devices that provide images to users, such as smartphones, tablet personal computers (PCs), digital cameras, notebook computers, navigation devices, and smart televisions (TVs) include display devices capable of displaying images.

A display device, which is a device for displaying an image, includes a display panel such as an organic light-emitting diode (OLED) display panel or a liquid crystal display (LCD) panel. A light-emitting display panel, in particular, may include light-emitting elements such as light-emitting diodes (LEDs), and examples of the LEDs include OLEDs using an organic material as a fluorescent material and inorganic LEDs (ILEDs) using an inorganic material as a fluorescent material.

The display device may further include a touch panel in addition to the display panel. The touch panel may be used in a capacitive manner. To transmit electrical signals between the touch panel and the display panel, a flexible circuit board with electronic parts mounted thereon for controlling the touch panel is attached to the touch panel.

The above information disclosed in this Background section is only for understanding of the background of the inventive concepts, and, therefore, it may contain information that does not constitute prior art.

SUMMARY

Devices constructed/methods according to exemplary implementations/embodiments of the invention are capable of forming a curved substrate in a display device According to one or more implementations/embodiments of the invention, a flexible substrate includes a main region; a bending region, extending from an end of the main region; and a sub-region, extending from an end of the bending region and reversed from the bending region to be attached on a rear surface of the main region; and an active element layer disposed in the main region of the flexible substrate, wherein a thickness of the flexible substrate is greater in the bending region than in the main region and the sub-region.

According to one or more exemplary implementations/embodiments of the invention, a method includes the steps of: mounting a target object, including a protective member and a target substrate, on a stage; bending the target substrate with a bending member; and firmly adhering the target substrate to the protective member with an adhesion member.

Devices constructed according to exemplary embodiments of the invention are capable of having a bent flexible circuit board with the load on the flexible circuit board minimized.

According to one or more implementations of the invention, a display device includes an apparatus for, and a method of, manufacturing a display device, which can bend a flexible circuit board while minimizing the load on the flexible circuit board.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

An embodiment of a display device includes a flexible substrate including a main region, a bending region, which extends from an end of the main region, and a sub-region, which extends from an end of the bending region, the sub-region being reversed from the bending region to be attached on a rear surface of the main region, and an active element layer disposed in the main region of the flexible substrate, wherein a thickness of the flexible substrate is greater in the bending region than in the main region and the sub-region.

An embodiment of an apparatus for manufacturing a display device includes a stage, an adhesion member disposed above the stage and including a body part and a curved part, and an adhesion driver rotating and driving the adhesion member, wherein the curved part is disposed on one side of the body part and is bent to have curvature.

An embodiment of a method of manufacturing a display device includes mounting a target object, including a protective member and a target substrate, on a stage, bending the target substrate with a bending member, and firmly adhering the target substrate to the protective member with an adhesion member.

According to the aforementioned and other embodiments of the present disclosure, a display device having a bent flexible circuit board with the load on the flexible circuit board minimized can be provided.

In addition, an apparatus for, and a method of, manufacturing a display device, which can bend a flexible circuit board while minimizing the load on the flexible circuit board, can be provided.

Other features and embodiments may be apparent from the following detailed description, the drawings, and the claims.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 6 is a side view of the apparatus of FIG. 5;

FIGS. 7 through 13 are side views illustrating a method of manufacturing a display device according to an embodiment of the invention of the present disclosure;

DETAILED DESCRIPTION

Figure 1:
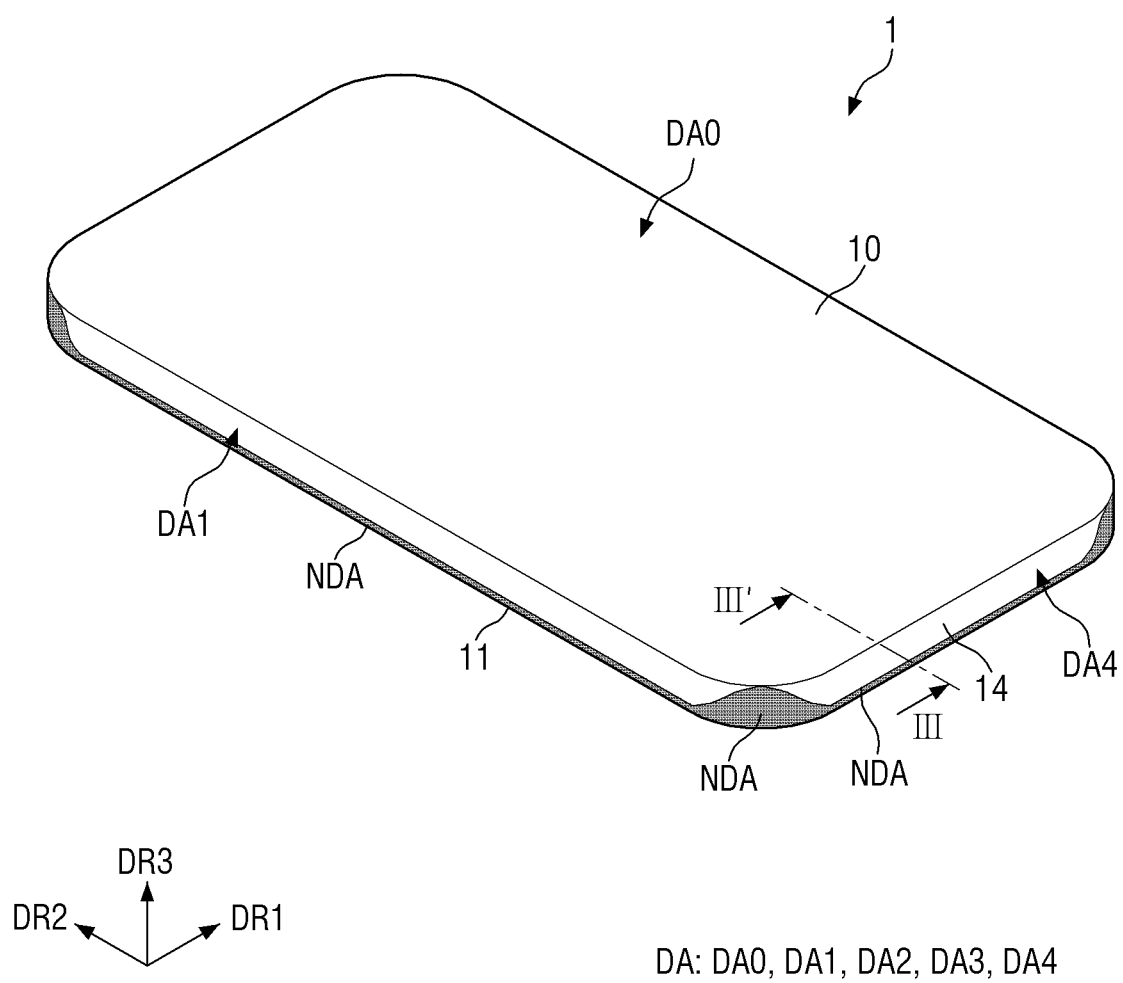
FIG. 1 is a perspective view of a display device according to an exemplary embodiment of the invention of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Embodiments of the present disclosure will hereinafter be described with reference to the accompanying drawings.

Figure 2:
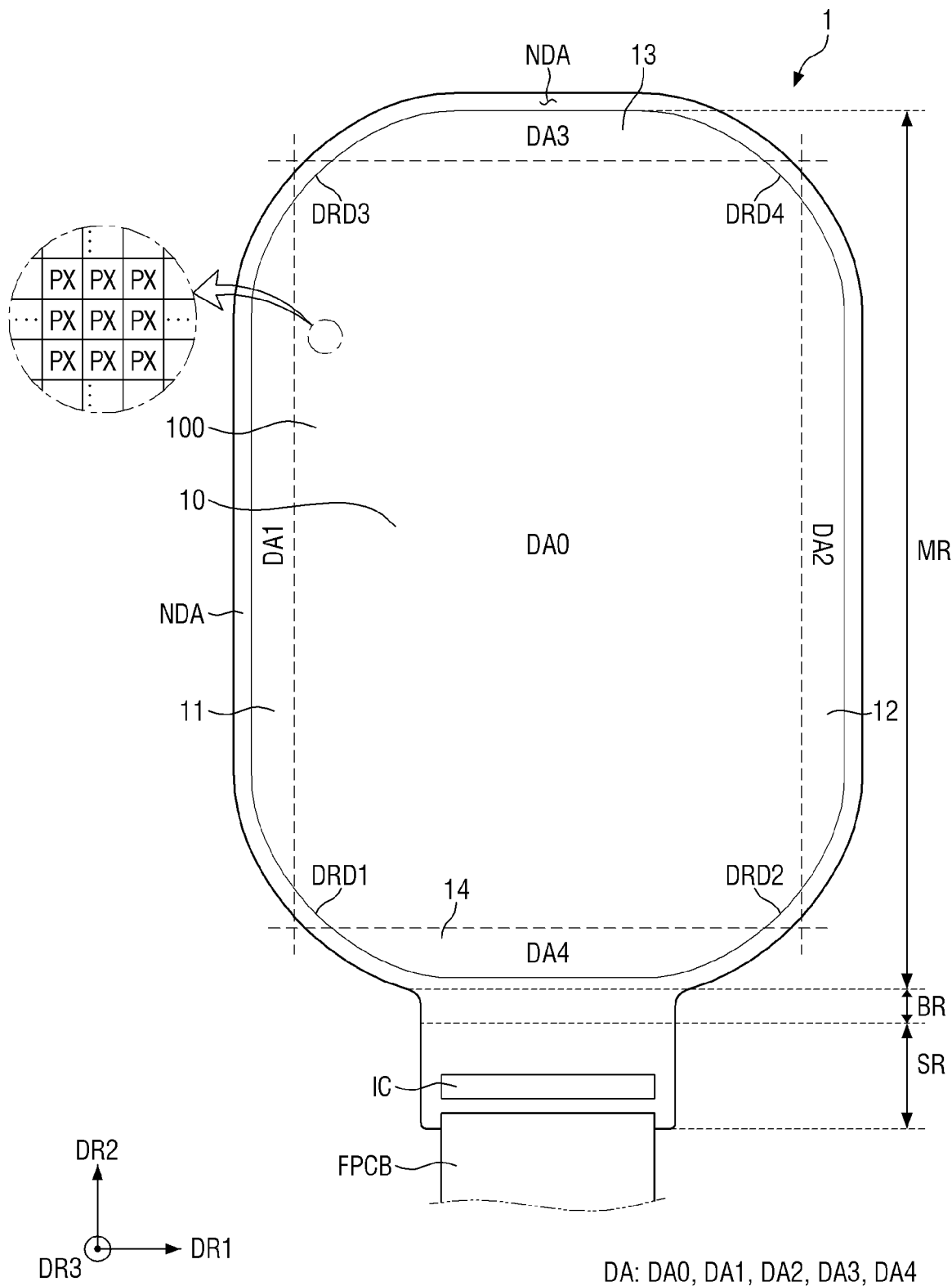
FIG. 2 is a development view of the display device of FIG. 1.

FIG. 1 is a perspective view of a display device according to an embodiment of the present disclosure. FIG. 2 is a development view of the display device of FIG. 1.

Referring to FIGS. 1 and 2, a display device 1 displays a moving or still image. The display direction of the main screen of the display device 1 may be a third direction DR3 (in the case of a top-emission display device), the opposite direction of the third direction DR3 (in the case of a bottom-emission display device), or both (in the case of a double-sided display device or a transparent display device).

The display device 1 may be formed in a substantially rectangular shape in a plan view. The display device 1 may have a rectangular shape with right-angled corners in a plan view, but the present disclosure is not limited thereto. Alternatively, the display device 1 may have a rectangular shape with rounded corners in a plan view. The display device 1 may include four sides, two of the four sides may be long sides, and the other two sides may be short sides. In other words, two sides, in a first direction DR1, of the display device 1 may be long sides, and two sides, in a second direction DR2, of the display device 1 may be short sides.

The display device 1 may include a main display surface 10 and a plurality of sub-display surfaces, i.e., first through fourth sub-display surfaces 11 through 14. The main display surface 10 may generally have a plate shape, may be located on one plane of the display device 1, and may have a larger area (or size) than the first through fourth sub-display surfaces 11 through 14. For example, the main display surface 10 may be located on the top surface of the display device 1. The main display surface 10 may have a polygonal shape (such as a rectangular shape), a circular shape, or an elliptical shape in a plan view.

The first through fourth sub-display surfaces 11 through 14 may be located on different planes from the main display surface 10. The first through fourth sub-display surfaces 11 through 14 may have a smaller area than the main display surface 10 and may be located on different planes from one another. The first through fourth sub-display surfaces 11 through 14 may be connected to the sides of the main display surface 10 and may be bent or folded from the main display surface 10. In this case, the display device 1 may be a multi-faceted stereoscopic display device capable of displaying an image not only on the top surface, but also on the side surfaces thereof.

The display device 1 may include the main display surface 10 and four sub-display surfaces connected to the four sides of the main display surface 10, i.e., the first through fourth sub-display surfaces 11 through 14, but the present disclosure is not limited thereto. Alternatively, the display device 1 may include only some of the first through fourth sub-display surfaces 11 through 14.

The display device 1 includes a display area DA, which displays a screen, and a non-display area NDA, which does not display a screen.

The display area DA may include a main display area DA0 and a plurality of sub-display areas, i.e., first through fourth sub-display areas DA1 through DA4. The main display area DA0 may be located on the main display surface 10. For example, the main display surface 10 may include only the main display area DA0. The first sub-display area DA1 may be located on the first sub-display surface 11 and may be connected to the main display area DA0. Similarly, the second through fourth sub-display areas DA2 through DA4 may be located on the second through fourth sub-display surfaces 12 through 14, respectively, and may be connected to the main display area DA0.

The non-display area NDA may be disposed around the display area DA. The non-display area NDA may be disposed along the outermost edges of the display area DA including the main display surface 10 and the first through fourth sub-display surfaces 11 through 14. Signal lines or driving circuits for applying signals to the display area DA may be disposed in the non-display area NDA.

The display device 1 may include a display panel 100, which provides a display screen. Examples of the display panel 100 include an organic light-emitting diode (OLED) display panel, a micro-light-emitting diode (micro-LED) display panel, a nano-light-emitting diode (nano-LED) display panel, a quantum-dot light-emitting diode (QLED) display panel, a liquid crystal display (LCD) panel, a plasma display panel (PDP), a field emission display (FED) panel, an electrophoretic display (EPD) panel, an electrowetting display panel, and the like. The display panel 100 will hereinafter be described as being, for example, an OLED display panel, but the present disclosure is not limited thereto. Various other display panels may also be applicable to the display device 1.

The display panel 100 may include a plurality of pixels PX. The pixels PX may be arranged in rows and columns. The pixels PX may have a rectangular or square shape in a plan view, but the present disclosure is not limited thereto. Alternatively, the pixels PX may have a rhombus shape having sides inclined with respect to the first direction DR1. Each of the pixels PX may include an emission area. Emission areas may have the same shape as, or a different shape from, the pixels PX.

The display panel 100 may include first through fourth display round parts DRD1 through DRD4, which are disposed at the corners of the main display surface 10. The first through fourth display round parts DRD1 through DRD4 may be substantially the same except for their location. The characteristics that the first through fourth display round parts DRD1 through DRD4 have in common will hereinafter be described, taking the first display round part DRD1.

The first display round part DRD1 is located between the first and fourth sub-display surfaces 11 and 14 (or between the first and fourth sub-display areas DA1 and DA4). One end of the first display round part DRD1 may extend to the edge of the first sub-display surface 11, and the other end of the first display round part DRD1 may extend to the edge of the fourth sub-display surface 14.

The first through fourth display round parts DRD1 through DRD4 may have substantially the same curvature or different curvatures. Alternatively, at least two of the first through fourth display round parts DRD1 through DRD3 may have substantially the same curvature. Alternatively, the first through fourth display round parts DRD1 through DRD4 may have a substantially uniform curvature or a varying curvature.

The display panel 100 may further include a main region MR and a bending region BR, which is connected to one side, in the second direction DR2, of the main region MR. The display panel 100 may further include a sub-region SR, which is connected to one side, in the second direction DR2, of the bending region BR and is bent in a thickness direction to overlap with the main region MR in the thickness direction. That is, the bending region BR may be located between the main region MR and the sub-region SR.

The display area DA may be located in the main region MR.

The bending region BR may be connected to one short side of the main region MR. For example, the bending region BR may be connected to one short side (e.g., the lower side) of the fourth sub-display surface 14. In a case where the fourth sub-display surface 14 is folded or bent vertically from the main display surface 10, the bending region BR may be folded or bent vertically once again from the main display surface 10. In the bending region BR, the display panel 100 may be bent to have curvature in an opposite direction to the display surface of the display panel 100.

The sub-region SR may extend from the bending region BR. In the sub-region SR, a pad unit may be disposed on the display panel 100. A driving chip IC may be mounted or attached on the pad unit. The driving chip IC may include an integrated circuit, which drives the display panel 100. In one embodiment, the integrated circuit may be a data driving integrated circuit generating and providing data signals, but the present disclosure is not limited thereto. The pad unit may include panel signal line pads and touch signal line pads.

In the sub-region SR, a driving substrate FPCB may be connected to the end of the display panel 100. The driving substrate FPCB may include a flexible printed circuit board or a film. FIG. 2 illustrates only part of the driving substrate FPCB, and the shape of the driving substrate FPCB, illustrated in FIG. 2, is only exemplary. For example, the driving substrate FPCB may have various shapes in a plan view, and the driving substrate FPCB may be connected to the display panel 100 not via a single part, but via multiple parts thereof.

Figure 3:
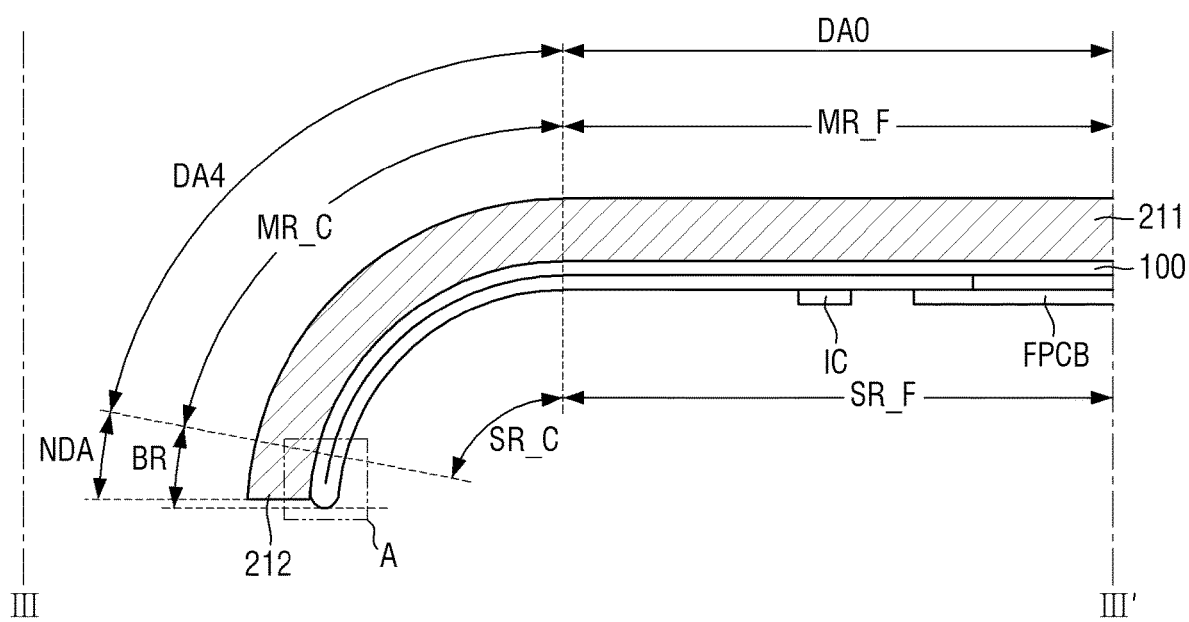
FIG. 3 is a cross-sectional view taken along line of FIG. 1.
Figure 4:
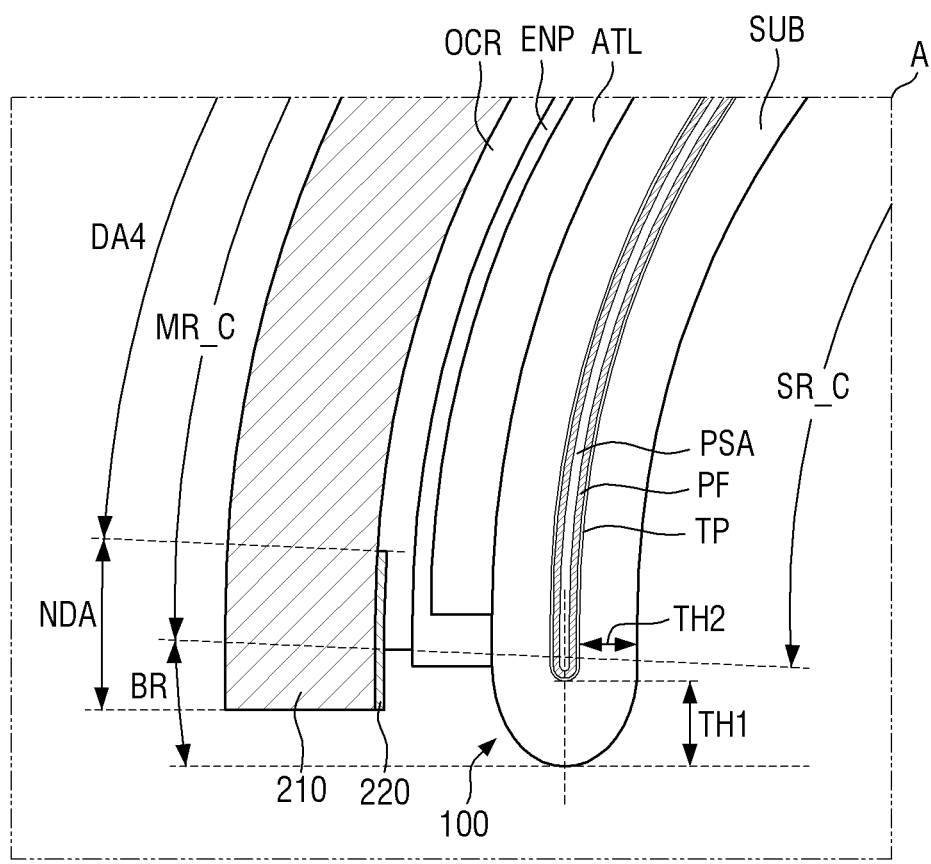
FIG. 4 is an enlarged cross-sectional view illustrating an area A of FIG. 3.

FIG. 3 is a cross-sectional view taken along line of FIG. 1. FIG. 4 is an enlarged cross-sectional view illustrating an area A of FIG. 3. FIGS. 3 and 4 are cross-sectional views taken along one short side of the display device of FIG. 1.

Referring to FIGS. 3 and 4, the display panel 100 may include a base substrate SUB, an active element layer ATL, and a thin-film encapsulation layer ENP.

The base substrate SUB provides space in which the active element layer ATL can be disposed, on a first surface thereof, and may support the active element layer ATL. The base substrate SUB may include a flexible polymer material such as polyimide and may thus be bendable, foldable, or rollable. That is, the base substrate SUB may include a flexible substrate.

The base substrate SUB may be bent in the bending region BR. Accordingly, the sub-region SR, which is disposed on the other side of the bending region BR, may be reversed from the bending region BR to be located on the rear surface of the main region MR. In this case, the main region MR of the base substrate SUB, which is disposed on one side of the bending region BR, and the sub-region SR of the base substrate SUB, which is on the other side of the bending region BR, may be firmly adhered to each other.

The main region MR may include a flat region MR_F, which is generally flat, and a curved region MR_C, which extends from one side of the flat region MR_F. Most of the flat region MR_F of the main region MR may be located in the main display area DA0, and most of the curved region MR_C of the main region MR may be located in the fourth sub-display area DA4.

The display area DA of the display device 1 may be disposed in and across the flat region MR_F and the curved region MR_C of the main region MR. In other words, the display area DA of the display device 1 may be disposed not only in at least part of the flat region MR_F of the main region MR, but also in at least part of the curved region MR_C of the main region MR.

The sub-region SR may include a flat region SR_F, which is generally flat, and a curved region SR_C, which extends from one side of the flat region SR_F. Most of the flat region SR_F of the sub-region SR may be located in the main display area DA0, and most of the curved region SR_C of the sub-region SR may be located in the fourth sub-display area DA4.

At least part of the flat region SR_F of the sub-region may be attached on the rear surface of the flat region MR_F of the main region MR, and at least part of the curved region SR_C of the sub-region SR may be attached to the rear surface of the curved region MR_C of the main region MR.

The shapes of the curved region MR_C of the main region MR and the curved region SR_C of the sub-region SR may correspond to the shape of a curved region 212 of a window member 200. That is, in a cross-sectional view, the curved region MR_C of the main region MR and the curved region SR_C of the sub-region SR may be bent along the shape of the curved region 212 of the window member 200.

A thickness TH1 of the base substrate SUB in the bending region BR may be greater than the thickness of the base substrate SUB elsewhere. In other words, the thickness TH1 of the base substrate SUB in the bending region BR may be greater than a thickness TH2 of the base substrate SUB in the main region MR and the sub-region SR. Specifically, the thickness TH1 of the base substrate SUB in the bending region BR may be 1.5 to 4 times greater than the thickness TH2 of the base substrate SUB elsewhere, but the present disclosure is not limited thereto.

The display panel 100 may further include a protective film PF, which is disposed on a second surface of the base substrate SUB. A double-sided tape TP may be disposed between the baes substrate SUB and the protective film PF to bond the base substrate SUB and the protective film PF, but the present disclosure is not limited thereto. The protective film PF may be attached on the second surface of the base substrate SUB, and the protective film PF may be bent in the bending region BR. In other words, the protective film PF may be integrally formed and disposed in and across the main region MR, the bending region BR, and the sub-region SR of the base substrate SUB and may be bent in the bending region BR. Part of the protective film PF attached to the main region MR of the base substrate SUB may partially face, and may be coupled via a bonding layer PSA (such as an adhesive) to, part of the protective film PF attached to the sub-region SR of the base substrate SUB. As a result, the mechanical stability of a bending structure can be improved.

The active element layer ATL may be disposed on the first surface of the base substrate SUB. The active element layer ATL may emit light that can display a screen in the display device 1. The active element layer ATL may include light-emitting elements, which emit light, and thin-film transistors, which drive the light-emitting elements. The active element layer ATL may be disposed in the main region MR, but the present disclosure is not limited thereto. The active element layer ATL may be disposed in the bending region BR and/or the sub-region SR.

The thin-film encapsulation layer ENP may be disposed on the active element layer ATL. The thin-film encapsulation layer ENP may cover the active element layer ATL to prevent the active element layer ATL from being exposed to moisture or the air.

The display device 10 may further include the window member 200. The window member 200 may be disposed on the display panel 100. The window member 200 may cover and protect the display panel 100. The window member 200 may be attached to a first surface of the display panel 100 via a transparent bonding layer OCR, which includes an optically clear adhesive or an optically clear resin. The window member 200 may include a window base 210 and a printed layer 220, which is disposed on the window base 210.

The window base 210 may be formed of a transparent material. The window base 210 may include, for example, glass or plastic. In a case where the window base 210 includes plastic, the window base 210 may have flexibility.

The window base 210 may include a flat region 211 and the curved region 212. The flat region 211 may be a region that is generally flat, and the planar shape of the flat region 211 corresponds to the planar shape of the display device 1. The curved region 212 may protrude outwardly from each of all four sides of the display panel 100. In other words, the window base 210 may be larger in size than the display panel 100 in a plan view, and the curved region 212 may extend from the flat region 211 to protrude from each of the sides of the display panel 100. The curved region 212 may have a bent shape in the thickness direction (or the third direction DR3).

The printed layer 220 may be disposed on the window base 210. The printed layer 220 may be disposed on a first surface and/or a second surface of the window base 210. The printed layer 220 may be disposed along the edges of the window base 210, in an inactive region NAR. The printed layer 220 may be a light-blocking layer or a decorative layer that imparts aesthetics.

Although not specifically illustrated, the display device 1 may further include a touch layer (not illustrated) and a polarizing member (not illustrated). The touch layer may be disposed on the thin-film encapsulation layer ENP. The touch layer may include a plurality of touch electrodes (not illustrated). The touch electrodes may be formed in a mesh form. The touch layer may not be provided.

The polarizing member may be disposed on the display panel 100. The polarizing member polarizes light transmitted therethrough. The polarizing member may reduce the reflection of external light.

Although not specifically illustrated, a cover panel (not illustrated) may be disposed on the second surface of the base substrate SUB. The cover panel may include a heat dissipation layer, a cushion layer, and the like. In this case, the driving substrate FPCB, which is disposed at one end of the base substrate SUB, may be adhered (or attached) and fixed to the cover panel.

An apparatus for manufacturing a display device according to an embodiment of the present disclosure will hereinafter be described.

Figure 5:
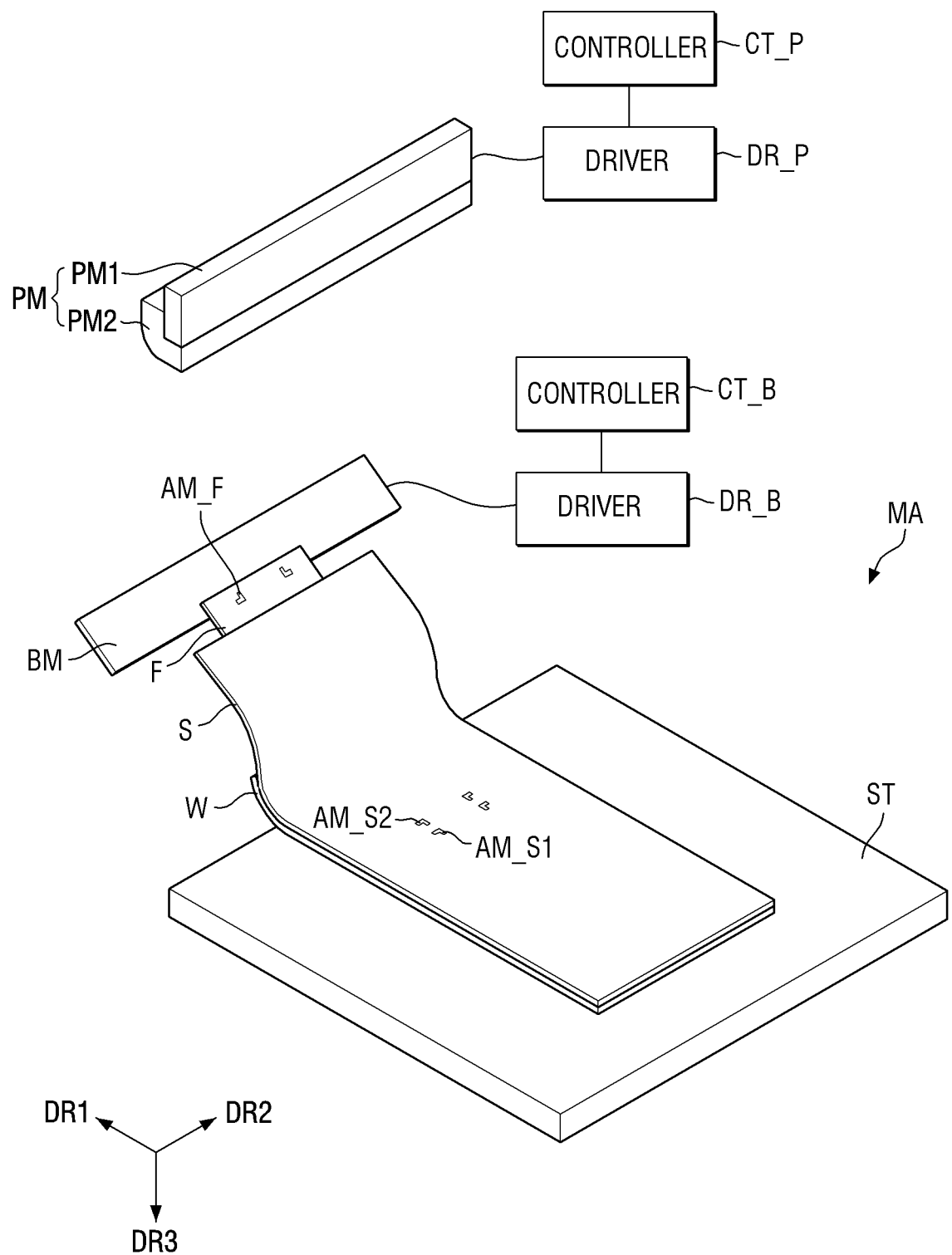
FIG. 5 is a layout view of an apparatus for manufacturing a display device according to an embodiment of the invention of the present disclosure.

FIG. 5 is a layout view of an apparatus for manufacturing a display device according to an embodiment of the present disclosure. FIG. 6 is a side view of the apparatus of FIG. 5.

Referring to FIGS. 5 and 6, an apparatus MA for manufacturing a display device may include a stage ST, a bending member BM, and an adhesion member PM.

The stage ST provides space on which a target object P can be mounted and supports the target object P. That is, the target P may be mounted on the stage ST. The stage ST may fix the target object P mounted thereon. Although not specifically illustrated, the stage ST may fix the target object P thereon with chucking means (not illustrated). The chucking means may fix the target object P using vacuum, static electricity, and/or a Van der Waals force. Also, the stage ST may move or rotate with the target object P mounted thereon and may thereby adjust the location and the direction of the target object P.

The target object P may include a protective member W, a target substrate S, and a flexible film F. The target object P may be transferred onto the stage ST by a robotic arm, but the present disclosure is not limited thereto. The protective member W may be substantially the same as the window member 200 of the display device 1, the target substrate S may be substantially the same as the display panel 100 of the display device 1, and the flexible film F may be substantially the same as the driving substrate FPCB. For convenience, the window member 200, the display panel 100, and the driving substrate FPCB of the display device 1 will hereinafter be referred to as the protective member W, the target substrate S, and the flexible film F, respectively.

The protective member W may be disposed directly on the stage ST. In other words, the protective member W may be disposed on the stage ST to be in direct contact with the stage ST. The protective member W may include a flat part WF, which is generally flat, and a curved part WC, which extends, and is bent, from the flat part WF in a thickness direction (or a third direction DR3). The curved part WC may be bent to have a predetermined curvature, but the present disclosure is not limited thereto. The flat part WF of the protective member W may be substantially the same as the flat region 211 of the window member 200, and the curved part WC of the protective member W may be substantially the same as the curved region 212 of the window member 200.

The target substrate S may be located on the protective member W. The target substrate S may be located on the flat part and the curved part WC of the protective member W. The target substrate S may have a thin plate shape. The target substrate S may have flexibility and may thus be bendable or foldable. For example, the target substrate S may include not only a display panel for a display device, but also a touch screen panel (TSP), but the present disclosure is not limited thereto. That is, the type of the target substrate S is not particularly limited.

The flexible film F may have a thin plate shape. The flexible film F may have flexibility to be bendable or foldable. For example, the flexible film F may include not only a flexible printed circuit board, but also a film member with an electronic element mounted thereon, but the present disclosure is not limited thereto. That is, the type of the flexible film F is not particularly limited.

First substrate alignment marks AM_S1 and second substrate alignment marks AM_S2 may be disposed on the target substrate S, and flexible film alignment marks AM_F may be disposed on the flexible film F. The first substrate alignment marks AM_S1 may be disposed on the inside of the second alignment marks AM_S2, on the target substrate S. In other words, when the target substrate S is yet to be bent, the first substrate alignment mark AM_S1 may be located further than the second substrate alignment mark AM_S2 from the flexible film F.

The target substrate S and the flexible film F may be aligned in the process of bending the target substrate S, using the first and second substrate alignment marks AM_S1 and AM_S2 and the flexible film alignment marks AM_F. The target substrate S and the flexible film F may be aligned based on the positional relationship between the first substrate alignment marks AM_S1, the second substrate alignment marks AM_S2, and the flexible film alignment marks AM_F. Although not specifically illustrated, the apparatus MA may further include a vision system (not illustrated), which can allow the positional relationship between the first substrate alignment marks AM_S1, the second substrate alignment marks AM_S2, and the flexible film alignment marks AM_F to be identified. The vision system may include a camera for identifying the locations of the first substrate alignment marks AM_S1, the second substrate alignment marks AM_S2, and the flexible film alignment marks AM_F.

The bending member BM may be disposed on one side, in a second direction DR2, of the stage ST. The bending member BM may be in contact with a first surface of the flexible film F, on one side of the flexible film F. That is, the flexible film F may be in contact with the bending member BM, on one side thereof, and may be connected to the target substrate S, on the other side thereof. The bending member BM may bend the target substrate S. In other words, the bending member BM may be connected to the flexible film F and may bend the target substrate S by moving the flexible film F. The bending member BM may have a bar shape that extends in a first direction DR1, but the present disclosure is not limited thereto. The bending member BM may fix the flexible film F. The bending member BM is illustrated as being disposed on the lower side of the flexible film F, but the present disclosure is not limited thereto. Alternatively, the bending member BM may be disposed on the upper side of the flexible film F.

The adhesion member PM may be disposed above the stage ST and the target object P already mounted on the stage ST. The adhesion member PM may firmly attach the target substrate S to the protective member W after the target substrate S is bent. The adhesion member PM may have a bar shape that extends in the first direction DR1, but the present disclosure is not limited thereto. The adhesion member PM may include a body part PM1 and a curved part PM2, which is disposed on one side of the body part PM1. The curved part PM2 may be bent to have a predetermined curvature, in a side view. The curvature of the curved part PM2 may be the same as the curvature of the curved part WC of the protective member W, but the present disclosure is not limited thereto.

The bending member BM may include a bending controller CT_B and a bending driver DR_B, and the adhesion member PM may include an adhesion controller CT_P and an adhesion driver DR_P. The operation of the bending member BM may be controlled by the bending controller CT_B, and the bending member BM may be driven by the bending driver DR_B. The operation of the adhesion member PM may be controlled by the adhesion controller CT_P, and the adhesion member PM may be driven by the adhesion driver DR_P. Each of the bending controllers CT_B and the adhesion controller CT_P may include a measurement unit (not illustrated), a memory unit (not illustrate), a signal unit (not illustrated), and a computation unit (not illustrated).

The memory unit may store a reference path or the moving path of the bending member BM or the adhesion member PM, measured by the measurement unit. The term "reference path", as used herein, may mean a previously-input path of the bending member BM or the adhesion member PM. The reference path, which is a path that can be experimentally derived or an ideal path, may be input and stored in advance. The reference path may be modified based on the measured moving path of the bending member BM or the adhesion member PM and may then be input again.

The signal unit may provide start and end signals to the measurement unit.

The measurement unit may start measuring the moving path of the bending member BM or the adhesion member PM in response to the start signal from the measurement unit and may stop measuring the moving path of the bending member BM or the adhesion member PM in response to the end signal from the signal unit.

The computation unit may compare the reference path and the moving path of the bending member BM or the adhesion member PM, measured by the measurement unit or may measure two or more moving paths of the bending member BM or the adhesion member PM, measured by the measurement unit.

Each of the bending controller CT_B and the adhesion controller CT_P may control the bending driver DR_B or the adhesion driver DR_P, which drives the bending member BM or the adhesion member PM, based on the result of the comparison conducted by the computation unit. That is, each of the bending controller CT_B and the adhesion controller CT_P may correct the moving path of the bending member BM or the adhesion member based on the result of the comparison conducted by the computation unit.

A method of manufacturing a display device according to an embodiment of the present disclosure, particularly, a method of manufacturing the display device of FIG. 1, will hereinafter be described.

Figure 9:
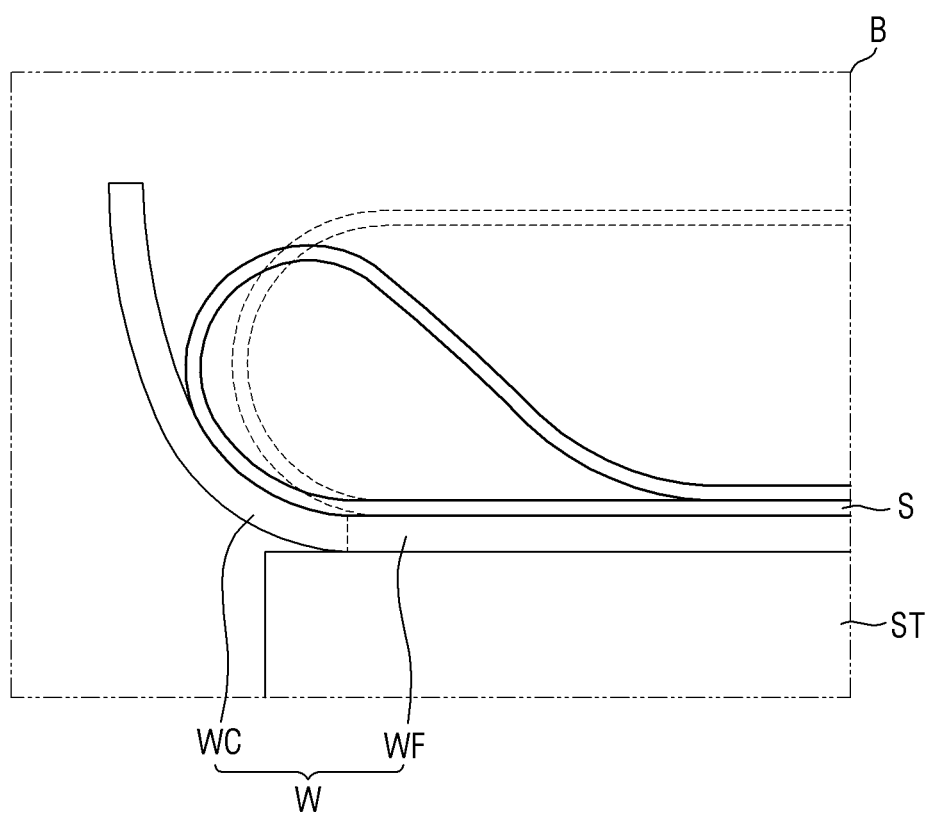
Figure 10:
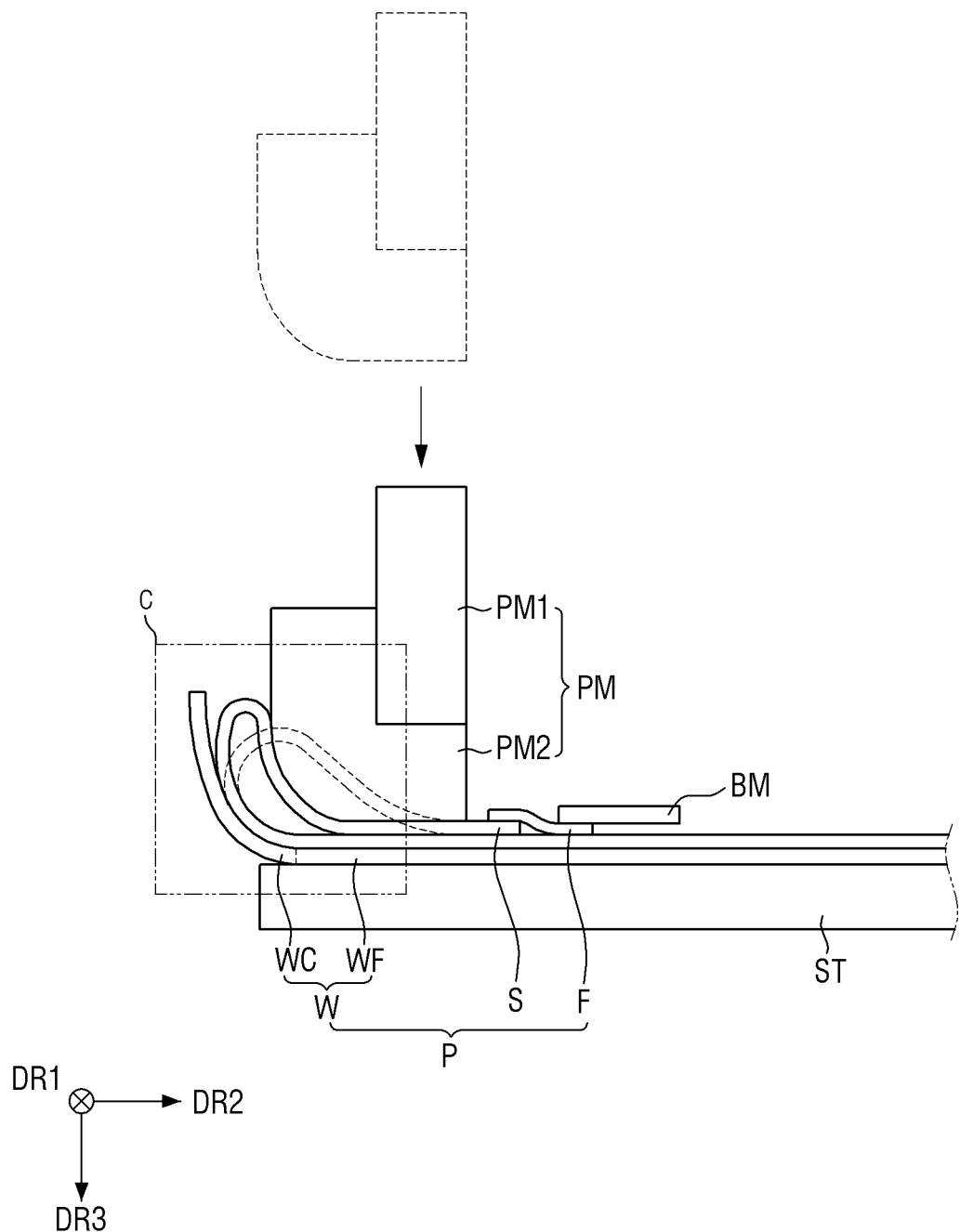
Figure 11:
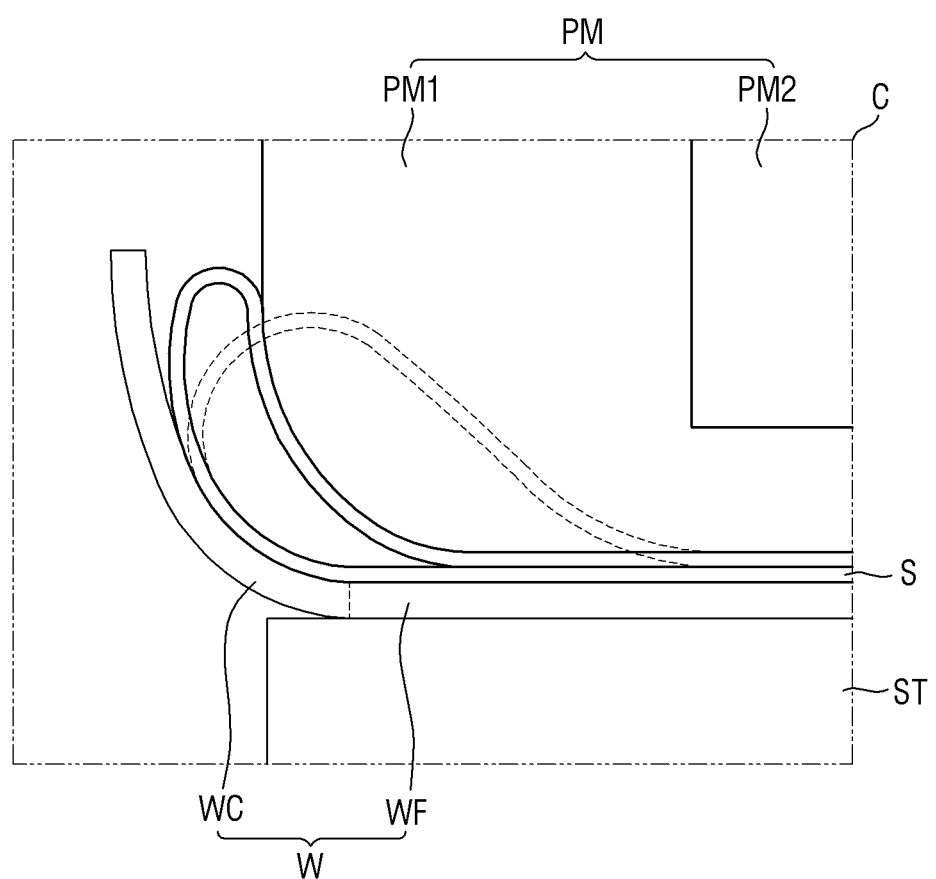
Figure 12:
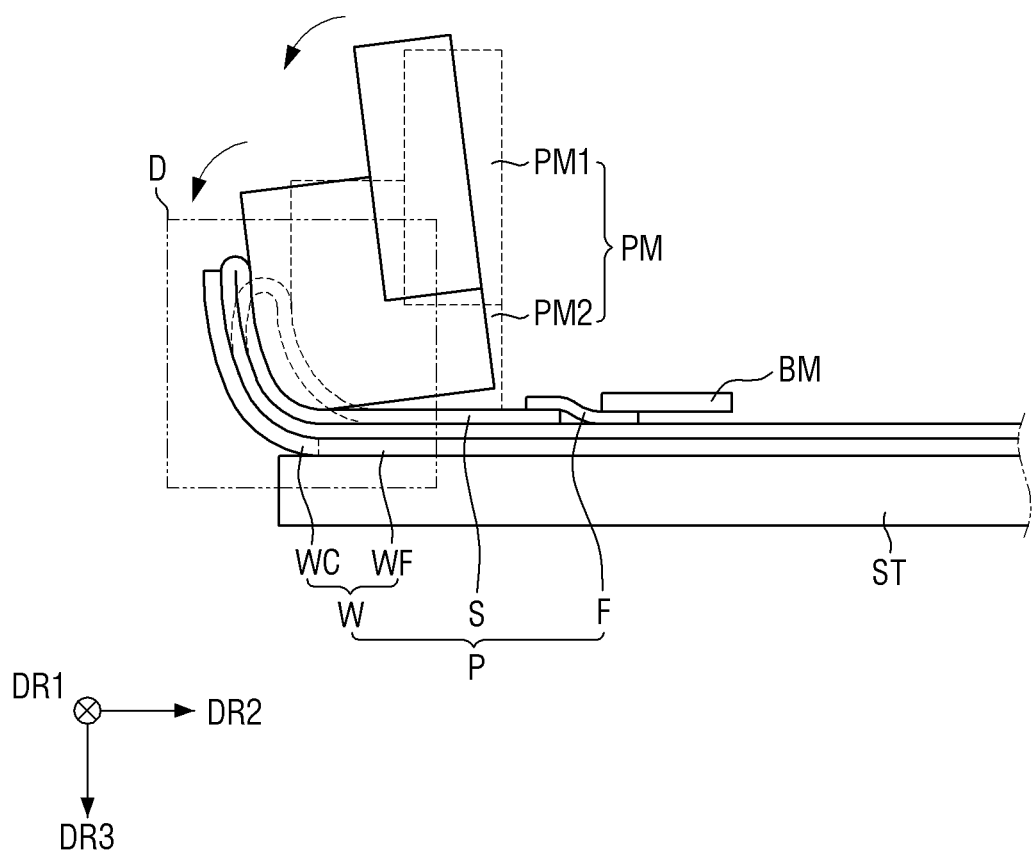
Figure 13:
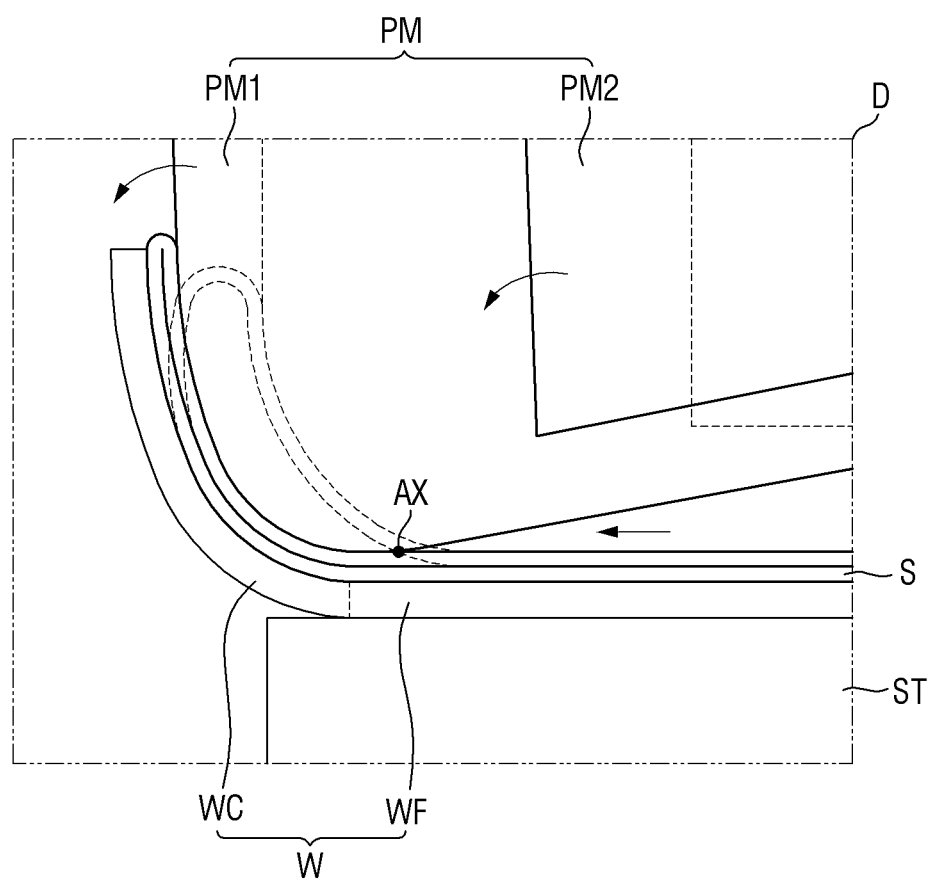

FIGS. 7 through 13 are side views illustrating a method of manufacturing a display device according to an embodiment of the present disclosure. Specifically, FIG. 9 is an enlarged side view illustrating an area B of FIG. 8, FIG. 11 is an enlarged side view illustrating an area C of FIG. 10, and FIG. 13 is an enlarged side view illustrating an area D of FIG. 12.

Figure 7:
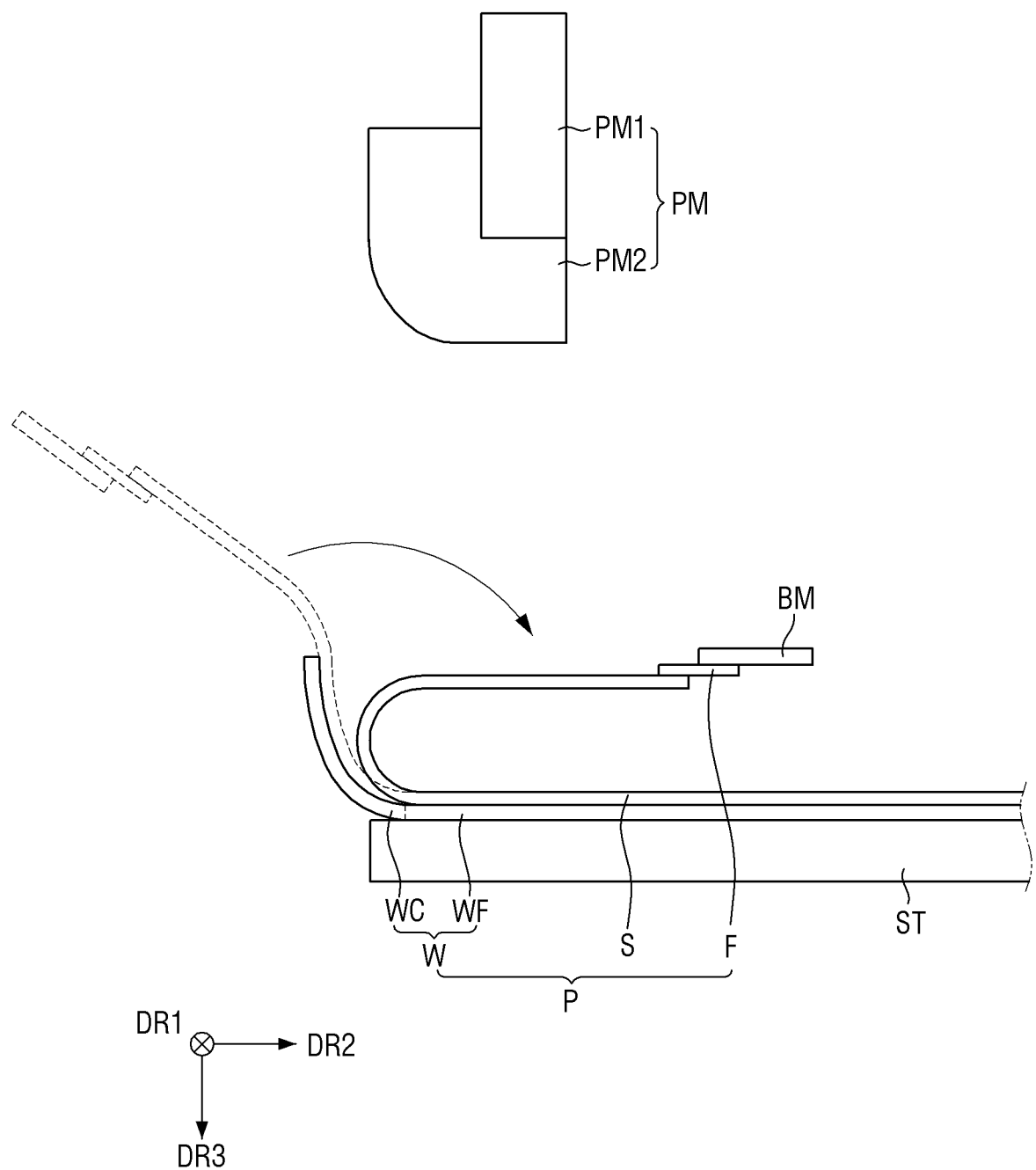

Referring first to FIG. 7, a bending member BM may bend a target substrate S. In other words, the bending member BM may bend the target substrate S, which is connected to a flexible film F, by being placed in contact with one surface of the flexible film F and pushing or pulling the flexible film F. Then, the bending member BM may be moved in a second or third direction DR2 or DR3 by a bending driver DR_B and may thus be rotated about a rotational axis (not illustrated) that extends in a first direction DR1.

As the target substrate S is bent, the bending member BM may be disposed to face a stage ST. Part of the target substrate S may overlap with, and face, another part of the target substrate S on the stage S. Part of the target substrate S may be a predetermined distance apart from the rest of the target substrate S that it faces. The flexible film F may overlap with, and face, both the target substrate S and the stage ST in a thickness direction (or the third direction DR3). The flexible film F may be a predetermined distance apart from the target substrate S.

Although not specifically illustrated, the positional relationship between first substrate alignment marks AM_S1, which are disposed on the target substrate S, and flexible film alignment marks AM_F, which are disposed on the flexible film F, may be identified, and the target substrate S and the flexible film F may be aligned based on the result of the identification, when the target substrate S, which is connected to the flexible film F, is being bent.

When the target substrate S is being bent, part of the target substrate S, previously disposed on the curved part WC of the protective member W, may no longer stay on, but may be detached from, the curved part WC of the protective member W. In other words, by bending the target substrate S, the part of the target substrate S, previously disposed on the curved part WC of the protective member W, may be placed a predetermined distance apart from the curved part WC.

It will hereinafter be described how to place the part of the target substrate S, detached from the curved part WC of the protective member W, back on the curved part WC of the protective member W, as part of the process of manufacturing a display device.

Thereafter, referring to FIGS. 8 and 9, after bending the target substrate S, the bending member BM may place the flexible film F in contact with the target substrate S. In other words, the bending member BM may move in the second direction DR2 or the thickness direction (or the third direction DR3) while being connected to the flexible film F, so that the flexible film F may be placed on the target substrate S. In other words, after bending the target substrate S, the bending member BM may move the flexible film F, which is spaced apart from the target substrate S, above the target substrate S, and may thus place the flexible film F in direct contact with the target substrate S, but the present disclosure is not limited thereto. Alternatively, the bending member BM may move in one of the second and third directions DR2 and DR3 while being connected to the flexible film F.

In this process, part of the target substrate S near the curved part WC of the protective member W may be placed back in contact with the curved part WC of the protective member W. In other words, as the bending member BM moves in the second direction DR2 and/or the thickness direction (or the third direction DR3) while being connected to the flexible film F, part of the target substrate S not in contact with the protective member W may move in the second direction DR2, toward the curved part WC of the protective member W. As a result, part of the target substrate S may be placed back in contact with the curved part WC of the protective member W, around the curved part WC of the protective member W.

Although not specifically illustrated, the location, in the second direction DR2, of the flexible film F may change in the process of placing the flexible film F in contact with the target substrate S with the bending member BM. In this case, the positional relationship between the second substrate alignment marks AM_S2 of the target substrate S and the flexible film alignment marks AM_F of the flexible film F may be identified, and then, the target substrate S and the flexible film F may be aligned. Also, in the process of placing the flexible film F in contact with the target substrate S with the bending member BM, the location, in the third direction DR3, of the flexible film F may change. In this case, a vision system (not illustrated) may further include a moving member (not illustrated) capable of moving a camera (not illustrated) in the first, second, or third direction DR1, DR2, and DR3, but the present disclosure is not limited thereto. Alternatively, by adjusting the focus of the camera may be adjusted in the third direction DR3, any changes in the locations, in the third direction DR3, the second substrate alignment marks AM_S2 and the flexible film alignment marks AM_F may be identified.

Thereafter, referring to FIGS. 10 and 11, by moving an adhesion member PM, which is disposed above the stage ST, in the third direction DR3, the target substrate S and the curved part WC of the protective member W may be placed in contact with each other over a wider area.

In other words, the adhesion member PM may be moved toward the target substrate S, above the target substrate S, and as a result, pressure may be applied to part of the target substrate S near the curved part WC of the protective member W, in the third direction DR3. Consequently, part of the target substrate S that is not fixed may be moved in the second direction DR2. Accordingly, part of the target substrate S may be placed back in contact with the curved part WC of the protective member W, around the curved part WC of the protective member W, and the curved part WC of the protective member W and the target substrate S may be in contact with each other over a wider area.

Thereafter, referring to FIGS. 12 and 13, the adhesion member PM may move and/or rotate in the second direction DR2. As aa result, the target substrate S and the curved part WC of the protective member W may be in contact with each other over an even wider area.

In other words, the adhesion member PM may be rotated by an adhesion driver DR_P (of FIG. 5). The adhesion driver DR_P, which rotates the adhesion member PM, may include a motor or a reducer, but the present disclosure is not limited thereto. The curved part WC of the protective member W and a curved part PM2 of the adhesion member PM may have the same curvature, and as the adhesion member PM rotates, parts of the target substrate S may be firmly adhered to each other on both sides of the region where the target substrate S is bent. The adhesion member PM may rotate about part thereof that is in contact with the target substrate S as a rotational axis AX. Part of the adhesion member PM where the rotational axis AX resides may be an inflection point where the slope of the target substrate S changes in a side view, but the present disclosure is not limited thereto. Parts of the target substrate S are illustrated as being firmly adhered to each other with a gap therebetween, as the adhesion member PM rotates, but the present disclosure is not limited thereto. Alternatively, there exists no gap between the parts of the target substrate S that are firmly adhered to each other.

The adhesion member PM not only rotates about the rotational axis AX but may also move in the second direction DR2. That is, the adhesion member PM may move in the second direction DR2, toward the curved part WC of the protective member W. Accordingly, the target substrate S may also move in the second direction DR2, toward the curved part WC of the protective member W, and the target substrate S may be placed in contact with the curved part WC of the protective member W, over an even wider area. That is, most of the curved part WC of the protective member W may be placed in contact with the target substrate S.

Although not specifically illustrated, the adhesion member PM may further include a sub-rotational axis (not illustrated). In other words, the adhesion member PM may further include a sub-rotational axis that extends in the first direction DR1, within the adhesion member PM, which also extends in the first direction DR1, and the adhesion member PM may rotate about the sub-rotational axis. In this case, the adhesion member PM may include a hinge structure, but the present disclosure is not limited thereto. Alternatively, the adhesion member PM may include a cylinder, a linear motor, or a spring.

The shapes of the target substrate S and the protective member W of FIG. 13 may be substantially the same as the shapes of the display panel 100 and the window member 200, respectively, of FIGS. 3 and 4.

Thus, even if the flexible film (or the driving substrate FPCB) is disposed on one side of the target substrate S (or the display panel 100) or the protective member W (or the window member 200) and is bent to have curvature, the target substrate S (or the display panel 100) can be firmly adhered on the protective member W (or the window member 200), and a display screen can be properly provided in the region where the target substrate S (or the display panel 100) and the protective member W (or the window member 200) are firmly adhered to each other.

Also, the load that may be applied to the target substrate S (or the display panel 100) can be reduced by firmly adhering the target substrate S (or the display panel 100) on part of the protective member W (or the window member 200) having curvature. Accordingly, the stress applied to the target substrate S (or the display panel 100) can be reduced, and damage to the target substrate S (or the display panel 100) can be prevented or suppressed.

Hereinafter, other embodiments of the display device will be described. In the following embodiments, a description of the same configurations as those of the embodiment described above will be omitted or simplified, and differences will be mainly described.

Figure 14:
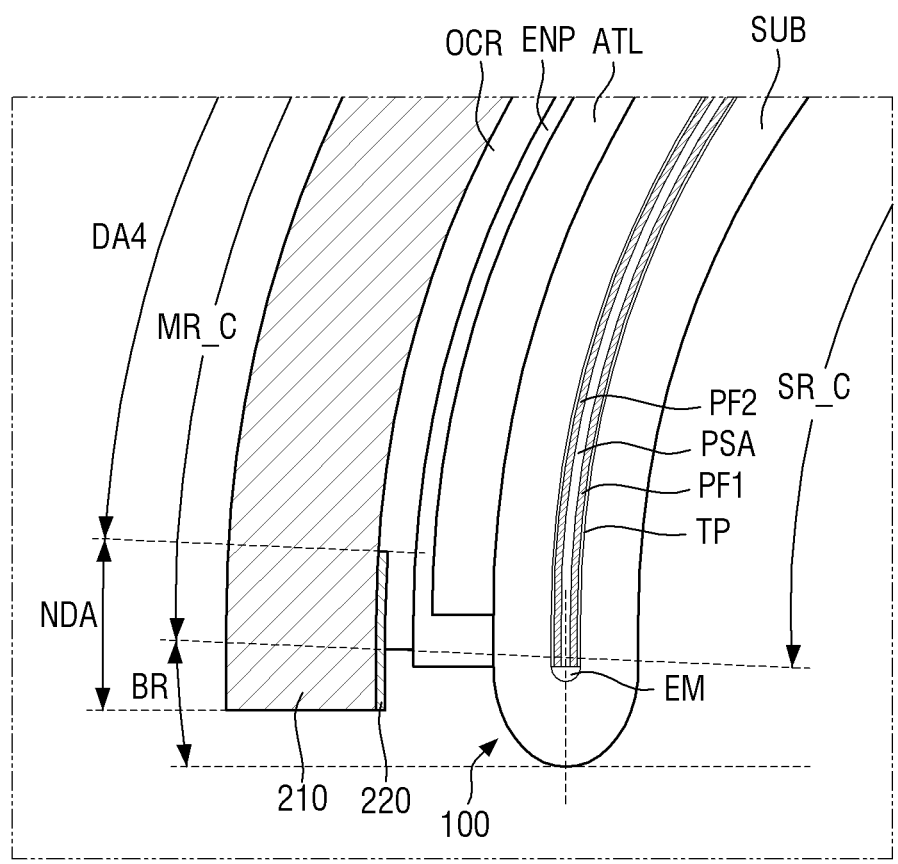
FIG. 14 is a partial cross-sectional view of a display device according to another embodiment of the invention of the present disclosure.

FIG. 14 is a partial cross-sectional view of a display device according to another embodiment of the present disclosure.

The embodiment of FIG. 14 differs from the embodiment of FIG. 4 in that a protective film PF1 is not formed in one body.

Referring to FIG. 14, the protective film PF_1 may include first and second protective films PF1 and PF2, which are separate from each other. In a case where a base substrate SUB is folded in a bending region BR, the first and second protective films PF1 and PF2 may face each other and may be coupled together via a bonding layer PSA such as an adhesive. The first protective film PF1 may be disposed on one side of the bending region BR, and the second protective film PF2 may be disposed on the other side of the bending region BR. The first protective film PF1 may be disposed in a main region MR of the base substrate SUB, and the second protective film PF2 may be disposed in a sub-region SR of the base substrate SUB.

Part of a double-sided tape TP that couples the first protective film PF1 and the base substrate SUB and part of the double-sided tape TP that couples the second protective film PF2 and the base substrate SUB may be separate from each other. Accordingly, an inner space EM may be defined between the first and second protective films PF1 and PF2 and between the parts of the double-sided tape TP that are separate from each other and may be empty, but the present disclosure is not limited thereto. Alternatively, the inner space EM may be filled with the double-sided tape TP or the bonding layer PSA.

In a case where the base substrate SUB is folded in the bending region BR, there may exist a region where the protective film PF_1 is not disposed, between parts of the base substrate SUB on both sides of the bending region BR.

The protective film PF_1 has been described above as including two separate films, i.e., the first and second protective films PF1 and PF2, but the present disclosure is not limited thereto. The number of films included in the protective film PF_1 and the locations of the films of the protective film PF_1 are not particularly limited.

In the embodiment of FIG. 14, like in the embodiment of FIG. 4, even if a driving substrate FPCB is disposed on a side of the display device of FIG. 14 where a bent part of a window member 200 is located, a display panel 100 can be firmly adhered on the window member 200, and a display screen can be properly provided in the region where the display panel 100 and the window member 200 are firmly adhered to each other.

Figure 15:
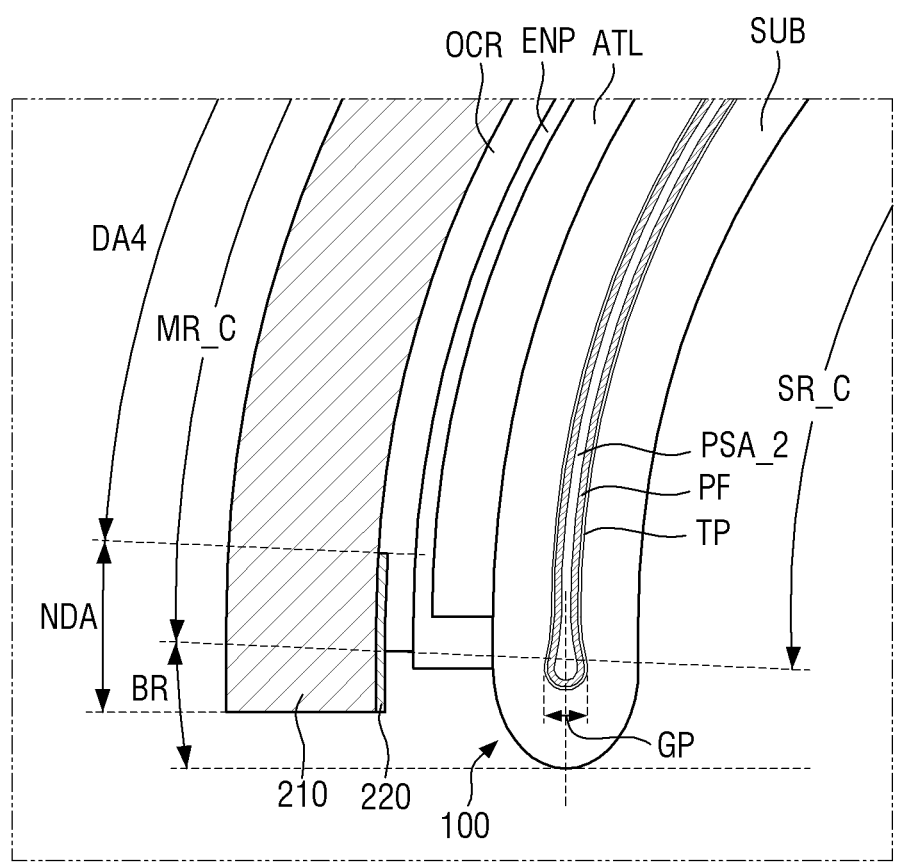
FIG. 15 is a partial cross-sectional view of a display device according to another embodiment of the invention of the present disclosure.

FIG. 15 is a partial cross-sectional view of a display device according to another embodiment of the present disclosure.

The embodiment of FIG. 15 differs from the embodiment of FIG. 4 in that the thickness of a bonding layer PSA_2 is not uniform.

Referring to FIG. 15, the thickness of the bonding layer PSA_2 may not be uniform. The thickness of the bonding layer PSA_2 between a main region MR and a sub-region SR of a base substrate SUB may increase and then decrease in a direction toward the bending region BR. In other words, a gap GP between the main region MR and the sub-region SR of the base substrate SUB may not be uniform. The gap GP between the main region MR and the sub-region SR of the base substrate SUB may widen in the direction toward the bending region BR.

The gap GP that widens in the direction toward the bending region BR may be formed in part due to how the display device of FIG. 15 is fabricated. That is, the gap GP that widens in the direction toward the bending region BR may be formed in the process of bonding the base substrate SUB from a location apart from the bending region BR to a location close to the bending region BR, but the present disclosure is not limited thereto.

In the embodiment of FIG. 15, like in the embodiments of FIGS. 4 and 14, even if a driving substrate FPCB is disposed on a side of the display device of FIG. 15 where a bent part of a window member 200 is located, a display panel 100 can be firmly adhered on the window member 200, and a display screen can be properly provided in the region where the display panel 100 and the window member 200 are firmly adhered to each other.

Figure 16:
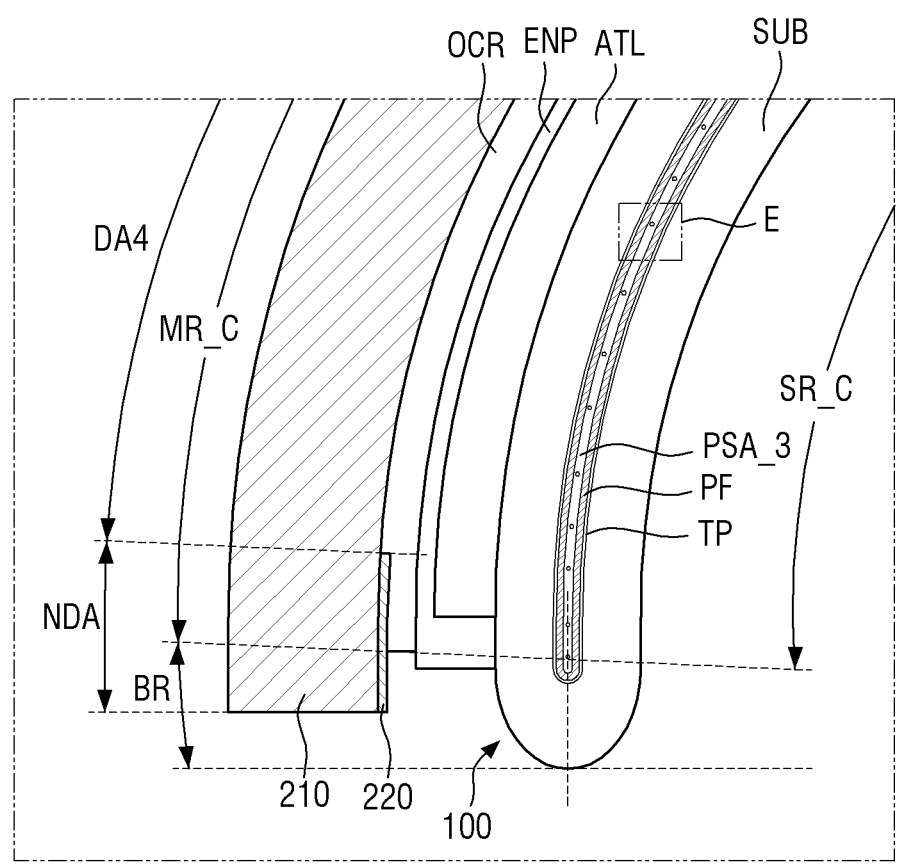
FIG. 16 is a partial cross-sectional view of a display device according to another embodiment of the invention of the present disclosure.
Figure 17:
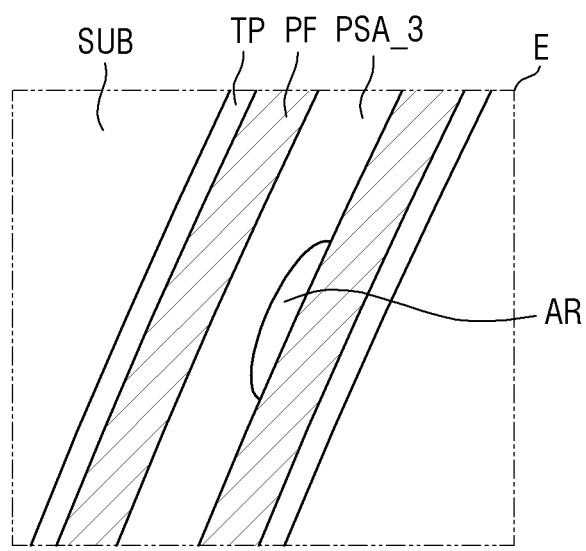
FIG. 17 is an enlarged cross-sectional view illustrating an area E of FIG. 16.

FIG. 16 is a partial cross-sectional view of a display device according to another embodiment of the present disclosure. FIG. 17 is an enlarged cross-sectional view illustrating an area E of FIG. 16.

The embodiment of FIGS. 16 and 17 differs from the embodiment of FIG. 4 in that a bonding layer PSA_3 may include an air layer AR (or air bubbles).

Referring to FIGS. 16 and 17, at least one air layer AR may be disposed in the bonding layer PSA_3. The air layer AR may be a sealed space filled with the air, but the present disclosure is not limited thereto. The air layer AR may be surrounded by the bonding layer PSA_3 or by both the bonding layer PSA_3 and a protective film PF, but the present disclosure is not limited thereto.

The air layer AR may be formed in part due to how the display device of FIGS. 16 and 17 is fabricated. That is, the air layer AR may be formed in the process of bonding a base substrate SUB from a location apart from a bending region BR to a location close to the bending region BR, but the present disclosure is not limited thereto.

In the embodiment of FIGS. 16 and 17, like in the embodiments of FIGS. 4, 14, and 15, even if a driving substrate FPCB is disposed on a side of the display device of FIGS. 16 and 17 where a bent part of a window member 200 is located, a display panel 100 can be firmly adhered on the window member 200, and a display screen can be properly provided in the region where the display panel 100 and the window member 200 are firmly adhered to each other.

In concluding the detailed description, those skilled in the art will appreciate that many variations and modifications can be made to the preferred embodiments without substantially departing from the principles of the present invention. Therefore, the disclosed exemplary embodiments of the invention are used in a generic and descriptive sense only and not for purposes of limitation.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a flexible substrate including:
a main region including a flat region and a curved region extending from one side of the flat region and having a first thickness;
a bending region, extending from an end of the main region and having a second thickness; and
a sub-region, extending from an end of the bending region and reversed from the bending region to be attached on a rear surface of the main region, the sub-region including a flat region and a curved region, which is curved; and
an active element layer disposed in the main region of the flexible substrate,
wherein the second thickness is greater than the first thickness, and
the bending region is connected to the curved region of the main region and the curved region of the sub-region.

2. The display device of claim 1, wherein at least part of the curved region of the sub-region is attached on a rear surface of the curved region of the main region.

3. The display device of claim 2, wherein at least part of the flat region of the sub-region is attached to a rear surface of the flat region of the main region.

4. The display device of claim 1, further comprising:
a display area displaying a screen,
wherein the display area is disposed in and across at least part of the flat region of the main region and at least part of the curved region of the main region.

5. The display device of claim 1, further comprising:
a protective film disposed between the main region and the sub-region.

6. The display device of claim 5, wherein the protective film is formed in one body, is disposed between the bending region and the sub-region, and is bent in the bending region.

7. The display device of claim 5, wherein
the protective film includes a first protective film and a second protective film, which are separate from each other, and
at least part of space between the first protective film and the second protective film is empty.

8. The display device of claim 1, wherein the main region and the sub-region are firmly adhered to each other.

9. The display device of claim 8, wherein a distance between the main region and the sub-region increases in a direction toward the bending region.

10. The display device of claim 1, further comprising:
at least one air bubble disposed between the main region and the sub-region.

11. The display device of claim 1, further comprising:
a printed circuit board attached to the sub-region of the flexible substrate.

12. The display device of claim 1, wherein
the display device has long sides and short sides, and
the bending region is disposed on one of the short sides of the display device.

* * * * *

UNITED STATES PATENT AND TRADEMARK OFFICE
CERTIFICATE OF CORRECTION

| | | |
|---|---|---|
| PATENT NO. | : 11,605,315 B2 | Page 1 of 1 |
| APPLICATION NO. | : 17/167961 | |
| DATED | : March 14, 2023 | |
| INVENTOR(S) | : Choi et al. | |

It is certified that error appears in the above-identified patent and that said Letters Patent is hereby corrected as shown below:

On the Title Page

Item (72) 4th inventor's city name should be corrected from "Anyang-si" to "Asan-si".

Signed and Sealed this
Twenty-seventh Day of June, 2023

Katherine Kelly Vidal
*Director of the United States Patent and Trademark Office*